United States Patent [19]
Wu

[11] Patent Number: 6,057,205
[45] Date of Patent: May 2, 2000

[54] METHOD TO FORM A RAGGED POLY-SI STRUCTURE FOR HIGH DENSITY DRAM CELLS

[75] Inventor: Shye-Lin Wu, Hsinchu, Taiwan

[73] Assignee: Texas Instruments - Acer Incorporated, Hsinchu, Taiwan

[21] Appl. No.: 09/014,862

[22] Filed: Jan. 28, 1998

[51] Int. Cl.[7] .................................................. H01L 21/20
[52] U.S. Cl. ........................................... 438/398; 438/255
[58] Field of Search ..................................... 438/255, 398, 438/253, 254, 396, 397

[56] References Cited

U.S. PATENT DOCUMENTS

| | | | |
|---|---|---|---|
| 5,670,405 | 9/1997 | Tseng | 438/255 |
| 5,696,014 | 12/1997 | Figura | 438/398 |
| 5,723,373 | 3/1998 | Chang et al. | 438/255 |
| 5,817,544 | 10/1998 | Tseng | 438/253 |
| 5,840,606 | 11/1998 | Lee | 438/255 |

*Primary Examiner*—Tuan H. Nguyen
*Attorney, Agent, or Firm*—Harness, Dickey & Pierce, P.L.C.

[57] ABSTRACT

A method for fabricating a capacitor on a semiconductor device is disclosed herein. The method includes the following steps. A first dielectric layer is formed on the semiconductor device in which the semiconductor device has a substrate. Next, a second dielectric layer is formed on the first dielectric layer. Successively, the first dielectric layer, the second dielectric layer and the semiconductor device is etched to form a hole contacting the substrate. Subsequently, a first conductive layer is formed in the hole and on the second dielectric layer. The next step is to pattern the first conductive layer to form a bottom electric electrode of the capacitor. Next, a third dielectric layer is formed on the first conductive layer to make a portion of the first conductive layer that is not covered by the third dielectric layer. The next step is to oxidize the third dielectric layer and the first conductive layer. The silicon dioxide layer is thus formed. Subsequently, the silicon dioxide layer is removed, after which the third dielectric layer and the portion of the first conductive layer are etched untill the third dielectric layer on the top surface of the first conductive layer is removed. Next, a dielectric film is formed on the third dielectric layer. Finally, a second conductive layer is formed on the dielectric film to form a top electric electrode of the capacitor.

16 Claims, 4 Drawing Sheets

METHOD TO FORM A RAGGED POLY-SI STRUCTURE FOR HIGH DENSITY DRAM CELLS

BACKGROUND OF THE INVENTION

1. Field of the Invention

The present invention relates to a method to form the ragged poly-silicon (poly-Si) structure for the DRAM cell, and more particularly, to a method for making a ragged poly-Si capacitor in the high density DRAM-cell.

2. Description of the Prior Art

Each semiconductor's memory cell consists typically of a storage capacitor and an access transistor. Since the basic element in the semiconductor's Dynamic Random Access Memory (DRAM) device is the memory cell, the manufacture of the memory-cell is essential to the DRAM. In fact, a memory-cell is provided for each bit stored by a DRAM-device. Either the source or the drain of the access transistor is connected to one terminal of the capacitor. The other side of the transistor and the transistor-gate-electrode are connected respectively to the external connecting-lines called a bit-line and a word-line. The other terminal of the capacitor is connected to a reference-voltage.

With the advent of Ultra Large Scale Integrated (ULSI) DRAM devices, the size of the memory cells has become smaller and smaller such that the area available for a single memory cell has become very small. The manufacture of a DRAM memory cell includes the fabrication of a transistor, a capacitor and contacts to periphery circuits. The devices of small area in the DRAM cell are thus most important for the designer. The planar capacitor is widely used in DRAM memory cells because the planar capacitor is relatively simple to fabricate yet the area of the planar capacitance is too big for the large-scale semiconductor device. Planar capacitors have been traditionally used due to their ease of manufacture, but as the memory cells decrease in size, the area of the planar capacitance also decreases. For very small size memory cells, it is not suitable to use the planar capacitance. Specifically, as the size of the capacitor decreases, the capacitance of the planar capacitor also decreases and the amount of the charge capable of being stored by the capacitor similarly decreases. This results in the capacitor being very susceptible to α particle interference.

Additionally, as the capacitance decreases, the charge held by the storage capacitor must be refreshed often. A simple stacked capacitor can not provide sufficient capacitance, even though high dielectric $Ta_2O_5$ is used as the insulator between the plates of the capacitor. Also, when the trench capacitor is used, the "gated diode leakage" resulting in the loss of the charge stored in the capacitor will make the capacitor fail to hold the charge, and then the logic level is missed. By reducing the thickness of the dielectric layer, the capacitance of the capacitor can also be improved. Yet, the problems related with using very thin dielectric materials and the yield have limited the usage. The stacked capacitor and the trench capacitor are developed to overcome the aforementioned problems.

If a better structure that can increase the capacitance of the capacitor is utilized, even though there may be a loss of charge, the sufficient charges in the capacitor can still be kept in the proper logic level. Moreover, once a better capacitor structure is proposed, its capacitance can be further improved by either using a thinner dielectric insulator or by selecting an insulator having a higher dielectric constant. Thus, a cylindrical capacitor using the Hemispherical Grained Si has been proposed (see "A NEW CYLIDRICAL CAPACITOR USING HEMISPHERICAL GRAINED Si FOR 256 Mb DRAMs", H. Watanabe et al., Tech Dig, December 1992, pp.259–262).

The structure of the capacitor over bit line (COB) cell with a hemispherical grain (HSG—Si) poly-silicon storage node has been developed (see "CAPACITOR-OVER-BIT LINE CELL WITH HEMISPHERICAL-GRAIN STORAGE NODE FOR 64 Mb DRAMs", M. Sakao et al., Microelectronics Research Laboratories, NEC Corporation. In IEDM Tech Dig., December 1990,pp. 655–658). This memory cell provides large storage capacitance by increasing the effective surface area of a simple storage node and is manufactured by optical delineation. The HSG—Si used to increase the effective area of the electrode of the capacitor is deposited by low-pressure chemical vapor deposition method at the transition temperature from amorphous Si to the polycrystalline Si. The HSG—Si storage node can be fabricated by addition of two process steps, i.e. HSG—Si deposition and an etchback. A HSG—Si electrode node has been proposed (see "A NEW CYLINDRICAL CAPACITOR USING HEMISPHERICAL GRAIN Si FOR 256 Mb DRAMs", H. Watanabe et al., Microelectronics Research Laboratories, NEC Corporation). After the electrode structure is formed, a native oxide on the electrode surface is removed by a diluted HF solution. HSG—Si appears on the silicon surface by using the seeding method.

SUMMARY OF THE INVENTION

To increase the effective area of the simple storage node of a capacitor, a method for fabricating a capacitor on a semiconductor device is disclosed herein. The semiconductor has a bit line and the capacitor is located over the bit line. The method mentioned above including the following steps:

First, a first dielectric layer is form on the semiconductor device, in which the semiconductor device has a substrate. Next, a second dielectric layer is formed on the first dielectric layer. Sequentially, the first dielectric layer, the second dielectric layer and the semiconductor device are etched and a hole contacting the substrate is thus formed.

Next, a first conductive layer is formed in the hole and on the second dielectric layer. Sequentially, the first conductive layer is patterned to form a bottom electric electrode of the capacitor. Next, a third dielectric layer is formed on the first conductive layer to make a portion of the first conductive layer that is not covered by the third dielectric layer. The third dielectric layer and the first conductive layer are successively oxidized to form a silicon dioxide layer. The successive step is to remove the silicon dioxide layer. Thus, the third dielectric layer and the portion of the first conductive layer are etched untill the third dielectric layer on the top surface of the first conductive layer is removed. The silicon dioxide layer is removed by using HF solution as an etchant, which has an etching selectivity between oxide and polysilicon of about 100 to 1. Next, a dielectric film on the third dielectric layer is patterned to form the dielectric film of the capacitor. Finally, a second conductive layer is patterned on the dielectric film to fabricate a top electric electrode of the capacitor.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

To increase the charge stored in the memory cell, the ragged poly-Si structure is used in enlarging the effective area of the capacitor in the memory cell without enlarging the area of the DRAM. A method for forming the ragged poly-silicon (poly-Si) structure in a high density DRAM cell is disclosed herein. The structure of the capacitor including the ragged poly-silicon structure includes (1) a ragged poly-silicon bottom storage node (2) a dielectric layer and (3) a top storage node. For those mentioned above, the capacitance of the memory cell is significantly increased as compared to the conventional stacked capacitor. The dielectric layer is formed along the surface of the ragged poly-silicon (poly-Si) bottom storage node.

In the preferred embodiment of the present invention, a single crystal silicon substrate with a crystallographic orientation of <100> is provided, and the thick field oxide (FOX) region formed in a conventional process provides isolation between devices on the silicon substrate.

Sequentially, a silicon dioxide layer is formed on the top surface of the substrate to serve as the gate oxide for subsequently forming the Metal Oxide Semiconductor Field Effect Transistors (MOSFETs). The silicon dioxide layer is formed by using an oxygen ambient, at a temperature of about 700–1100° C. in one embodiment. In the other embodiment, the oxide layer may be formed using any suitable oxide chemical procedures, the thickness of the FOX is about 3000–8000 angstroms and the thickness of the silicon dioxide layer is approximately 15–200 angstroms.

Figure 1:
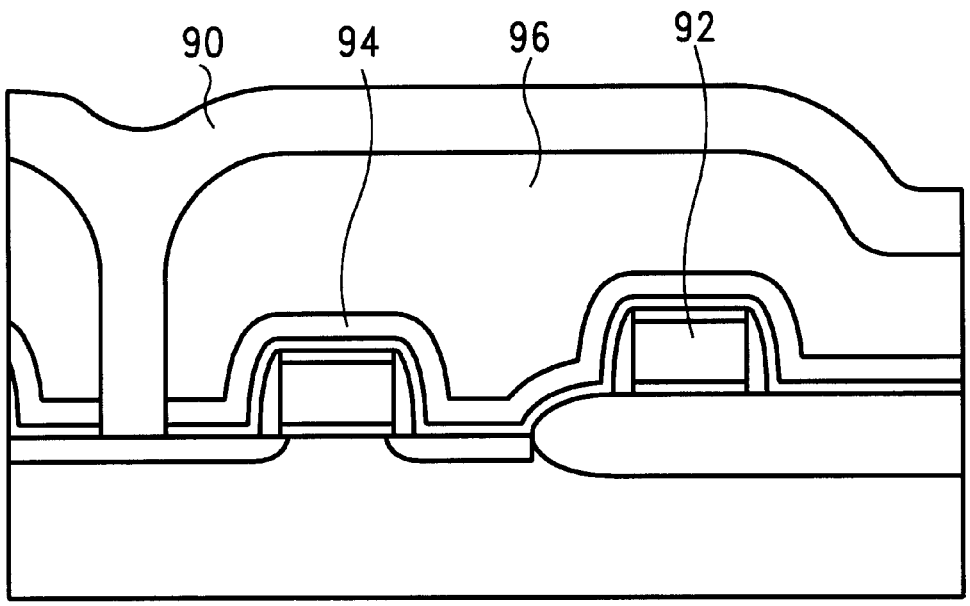
FIG. 1 illustrates a cross-sectional view of the semiconductor device having a substrate, a bit line, a MOSFET, and a word line.
Figure 2:
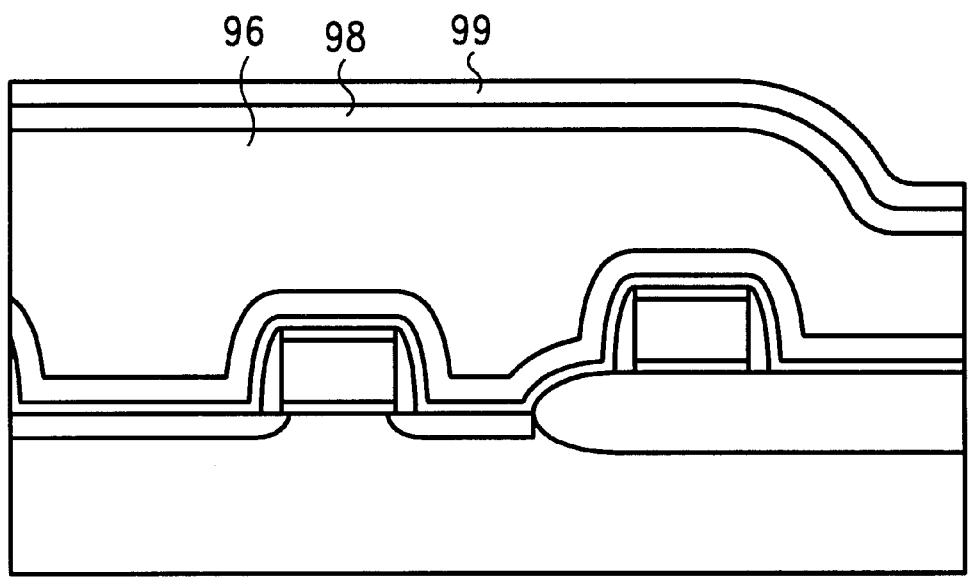
FIG. 2 illustrates a cross-sectional view of the semiconductor device with two dielectric layers formed on the semiconductor device.

The following step is to form a doped poly-silicon layer over the FOX region and a silicon dioxide layer by a Low Pressure Chemical Vapor Deposition (LPCVD) process. In this embodiment, the first poly-silicon layer is about 500–2000 angstroms in thickness. The silicide layer, such as tungsten silicide, is then formed on the first poly-silicon layer. Next, standard photolithography and the etching steps are used to form a gate structure and a local interconnection. Subsequently, the active regions (i.e., the source and the drain electrodes of the MOSFETs) are formed by a well-known process such as implanting appropriate impurities. After forming a metal layer on the substrate, well known patterning and etch processes are used to etching the metal layer to form a bit line. The fabrication of the ragged poly-Si capacitor described herein includes many steps that are well known in the art. The Widely used processes such as photolithography masking and etching are well known in the art and are used extensively herein without a related discussion of these well-known technologies. The cross-sectional view of the wafer being processed by aforementioned steps is shown in FIG. 1, which shows the bit line 90, the word line 92, the MOSFET 94 and the first dielectric layer 96. The first dielectric layer 96 is preferably formed by borophosphosilicate glass (BPSG) or TEOS-oxide. The other cross-sectional view is shown in FIG. 2, in which the second dielectric layer 98 is formed on the first dielectric layer 96, and the third dielectric layer 99 is formed on the second dielectric layer 98. The second dielectric layer 98 is preferably the CVD (Chemical Vapor Deposition) oxide, and the third dielectric layer is preferably formed of silicon nitride. The thickness of the third dielectric layer 99 is preferably about 500–2000 angstroms.

Figure 3:
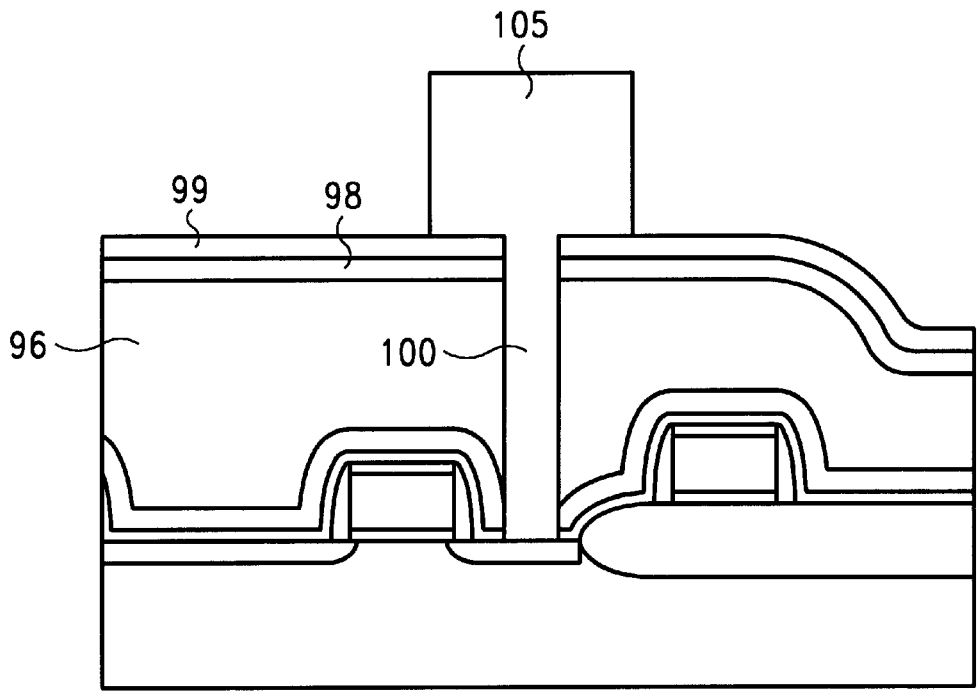
FIG. 3 shows a storage node defined in and on the semiconductor device to be the bottom electrode of the capacitor.

The next step is to utilize the widely used processes, such as the photolithography masking and etching, to define the capacitor-over-bit line (COB) storage node. Referring to FIG. 3, a contact hole 100 is formed in the first dielectric layer 96, the second dielectric layer 98 and the third dielectric layer 99 by patterning and etching. A first conductive layer 105 is formed over and in the contact hole 100 and on the third dielectric layer 99. The first conductive layer 105 is preferably formed using conventional LPCVD process. The thickness of the first conductive layer 105 as measured over the third dielectric layer 99 is preferably in the range of 300–1000 angstroms. The first conductive layer 105 is preferably the doped polysilicon. A photoresist is patterned on the first conductive layer 105 and then an etching process is utilized, by using the photoresist as an etching mask to etch the first conductive layer 105. The following step is to strip the photoresist, and then the storage node is formed.

Figure 4:
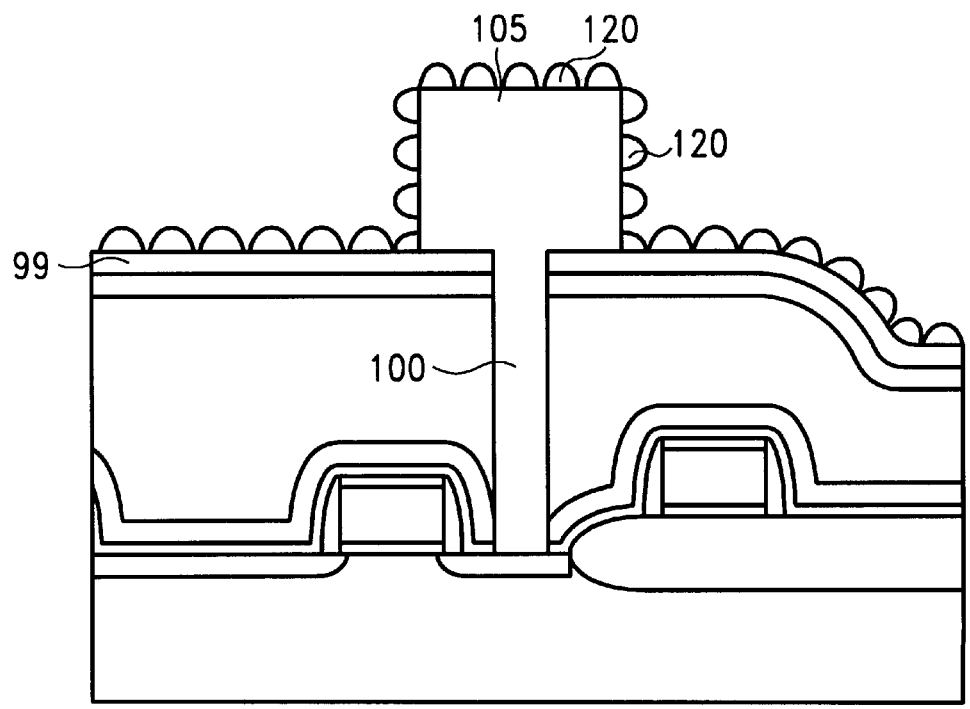
FIG. 4 shows a HemiSpherical Grain poly-silicon (HSG—Si) formed on the storage node and the semiconductor device.
Figure 5:
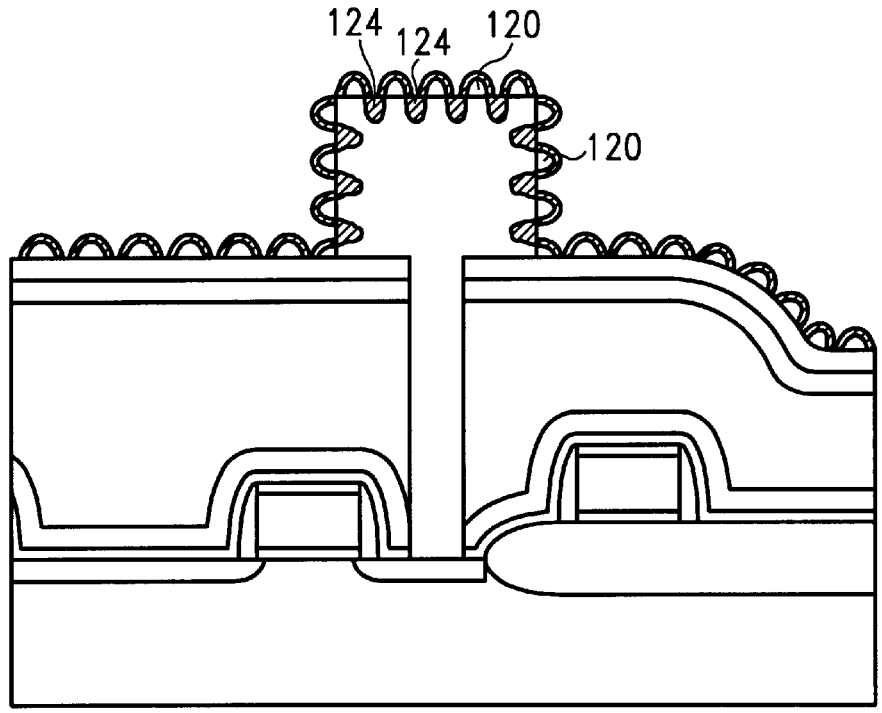
FIG. 5 shows a silicon dioxide layer formed on the surface of the HSG—Si and the surface of the storage node.
Figure 6:
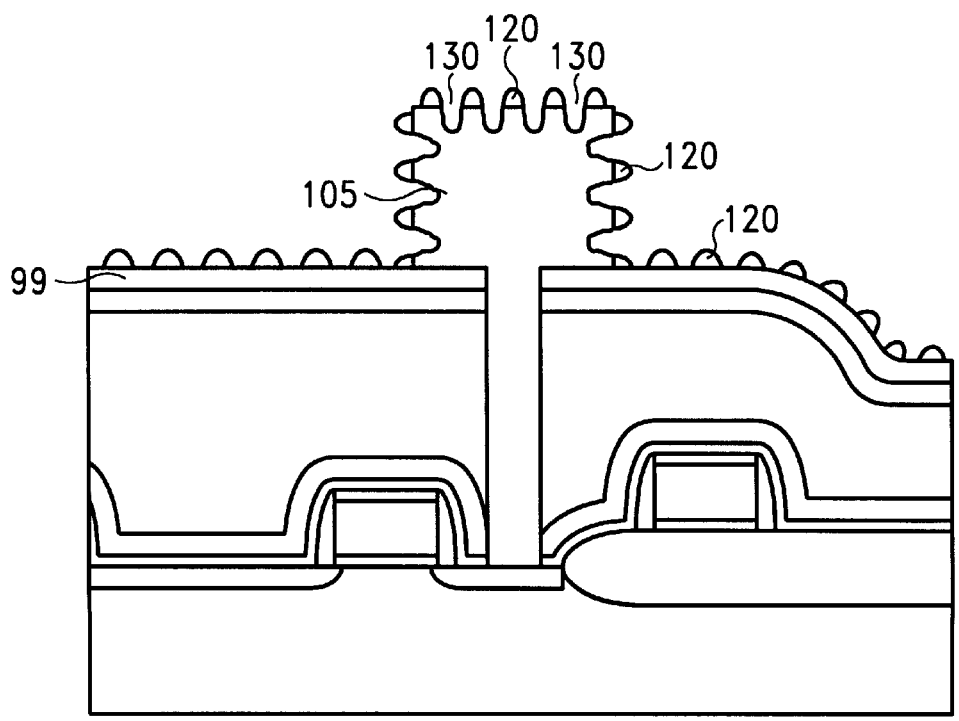
FIG. 6 shows the silicon dioxide layer formed on the surface of the HSG—Si and the surface of the storage node removed.
Figure 7:
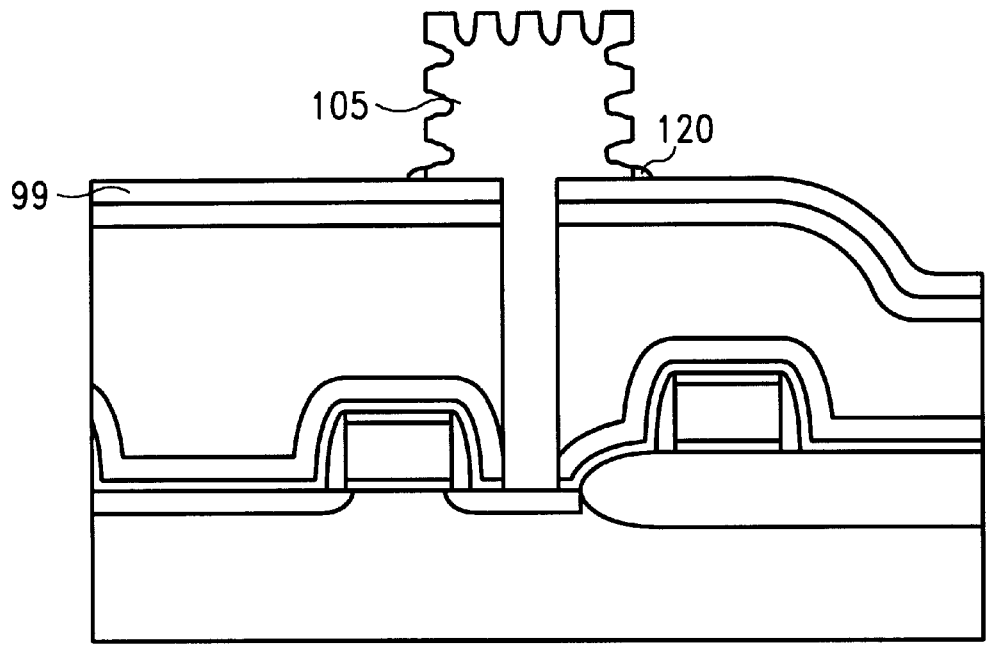
FIG. 7 shows the HSG—Si on the top surface of the storage node removed.

Turning now to FIG. 4, an undoped HemiSpherical Grains silicon (HSG—Si) layer 120 is formed on the first conductive layer 105 and the third dielectric layer 99. The next step is to slightly etch the first conductive layer 105 and the HSG—Si layer 120, then a low temperature wet oxidation in oxygen ambient is used to form the thermal oxide on the surface of the first conductive layer 105 and the HSG—Si layer 120. In this embodiment, the oxidation temperature is about 700–950° C. and the oxidation process preferably continues for 5–120 minutes. Referring to FIG. 5, the oxide layer 124 on the surface of the first conductive layer 105 is thicker than that of the HSG—Si layer 120, due to the difference oxidation rate between the doped poly-silicon and the undoped HSG—Si. The diluted HF solution is used to remove the oxide layer 124. As shown in FIG. 6, the oxide layer 124 is removed, and a plurality of grooves 130 are created in the first conductive layer 105. The high etching selectivity between oxide and polysilicon (the relative susceptibility is about 100 to 1) is used to achieve this end. This procedure causes grooves 130 to be formed in the polysilicon, and the grooves 130 have a depth of the order of 100–1000 angstroms. The residual HSG—Si islands are left on the paysilicon layer and the silicon nitride layer after the procedure. Because the diluted HF solution cannot etch silicon nitride, there is not a groove in the third dielectric layer 99. The next step is to etch back the HSG—Si layer 120 by dry etching. The portions of the first conductive layer 105 without the coverage of the HSG—Si layer 120 are etched. Referring to FIG. 7, the HSG—Si layer 120 on the top surface of the first conductive layer 105 and the third dielectric layer 99 is removed, meanwhile, the depth of the grooves 130 is increased by the dry etching. The HSG—Si layer 120 on the vertical surface of the first conductive layer 105 can be remain because a portion of the grains of the HSG—Si layer 120 on the vertical surface acts as a mask. The etchant of the aforementioned dry etching process can be $SiCl_4/Cl_2$, $SF_6$, $HBr/O_2$, or $BCl_3/Cl_2$.

Figure 8:
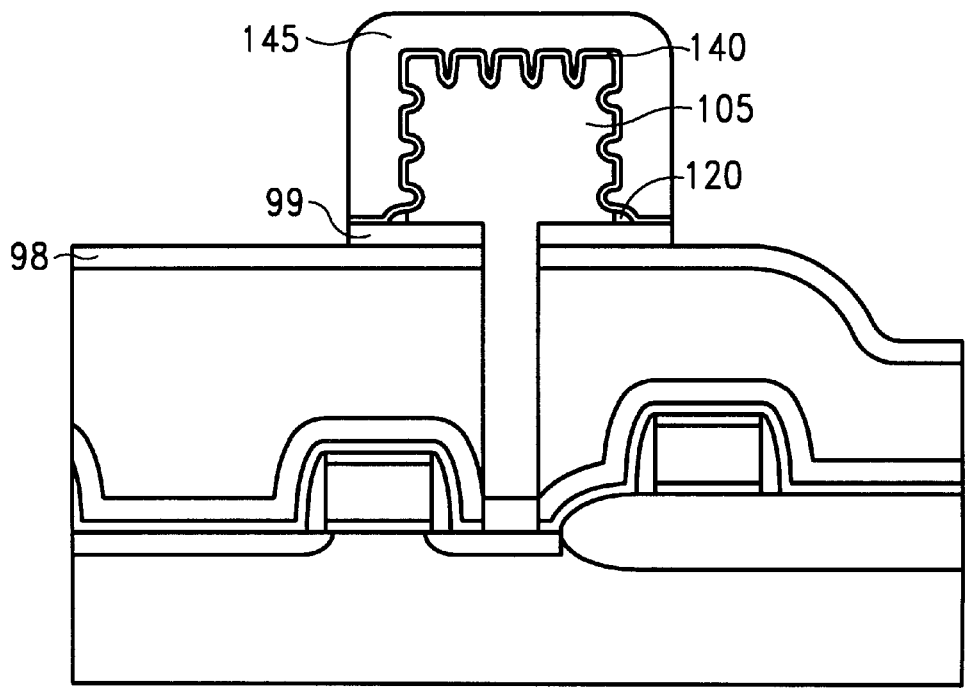
FIG. 8 shows a dielectric film is formed on the surface of the storage node as the dielectric film of the capacitor, and a second conductive layer formed on the surface of the dielectric film as the top electrode of the capacitor.

Turning next to FIG. 8, the dielectric film 140 is deposited and patterned on the surface of the first conductive layer 105 and the third dielectric layer 99. The third dielectric layer 99, if utilized, is preferably removed by wet etching. In the preferred embodiment, the etchant is preferably hot phosphoric acid, which dissolves the third dielectric layer 99 but not layer 98. A dielectric film 140 is then deposited on the exposed surface of the first conductive layer 105. The dielectric film 140 is preferably formed of either a double film of nitride/oxide film, a triple film of oxide/nitride/oxide or any other high dielectric film including tantalum oxide ($Ta_2O_5$), BST, PZT, etc. If $Ta_2O_5$, BST, or PZT are used as the dielectric film 140, then a composition layer which is composed of barrier metal layer/metal layer must be formed on the first conductive layer 105 before the dielectric film 140 is formed. This is because these dielectric films must be used in a metal-insulator-metal (MIM) structure. Further, if the third dielectric layer 99 is utilized and dissolved, as is preferred, then the dielectric wraps around the gouged-out surface and under much of the lower surface of conductive layer 105, thereby increasing further the surface area of the first plate of this capacitor which is being formed. After the dielectric film 140 is deposited, a second conductive layer 145 is deposited by using a conventional LPCVD process over the dielectric film 140. The second conductive layer 145 provides a top storage electrode and is formed of doped polysilicon, in-situ doped polysilicon, aluminum, copper, tungsten or titanium. In addition, if $Ta_2O_5$, BST, PZT, or PLZT are used to serve as the dielectric film 140, then the second conductive layer 145 must be metal to form a metal-insulator-metal (MIM) structure. Thus, a semiconductor capacitor, which comprises a second conductive layer 145 as its top storage electrode, a dielectric 140, and a first conductive layer 105 as the bottom storage electrode is formed. Thus, the cell plate of the DRAM cell is fabricated.

Therefore, the present invention improves the performance of the capacitor. As will be understood by persons skilled in the art, the foregoing preferred embodiment of the present invention is illustrative of the present invention rather than being limiting on the present invention. Although specific embodiments have been illustrated and described, it will be obvious to those skilled in the art that various modification may be made without departing from the spirit which is intended to be limited solely by the appended claims.

What is claimed is:

1. A method for fabricating a capacitor on a semiconductor device, said method comprising:

forming a first dielectric layer on said semiconductor device, said semiconductor device being on a substrate;

forming a second dielectric layer on said first dielectric layer;

etching said first dielectric layer, said second dielectric layer and said semiconductor device to form a hole contacting said substrate;

forming a first conductive layer in said hole and on said second dielectric layer;

patterning said first conductive layer to form a bottom electrode of said capacitor, wherein said first conductive layer comprises doped poly-silicon;

forming a third dielectric layer on said first conductive layer, a portion of said first conductive layer is not covered by said third dielectric layer;

oxidizing said third dielectric layer and said first conductive layer to form a silicon dioxide layer on said third dielectric layer and said portion of said first conductive layer;

removing said silicon dioxide layer;

etching said third dielectric layer and said portion of said first conductive layer till said third dielectric layer on the top surface of said first conductive layer is removed;

patterning a dielectric film on said first conductive layer and on said third dielectric layer at side wall of said first conductive layer to form the dielectric film of said capacitor; and patterning a second conductive layer on said dielectric film to form a top electrode of said capacitor, said first conductive layer, said third dielectric layer at side wall of said first conductive layer, said dielectric film on surface of said first conductive layer and on said third dielectric layer at side wall of said first conductive layer, and said second conductive layer constituting said capacitor.

2. The method as claim 1, wherein said method further comprises removing said second dielectric layer before patterning said second conductive layer.

3. The method as claim 1, wherein said first dielectric layer is a Chemical Vapor Deposition (CVD) silicon dioxide layer.

4. The method as claim 1, wherein said second dielectric layer is silicon nitride layer.

5. The method as claim 1, wherein said third dielectric layer comprises undoped poly-silicon.

6. The method as claim 1, wherein said silicon dioxide layer is formed by low temperature wet oxidation in oxygen ambient in the oxidation temperature about 700–950° C.

7. The method as claim 1, wherein said silicon dioxide layer is removed by an etchant having the etching selectivity between oxide and polysilicon about 100 to 1.

8. The method as claim 1, wherein said dielectric film comprises a first oxide film and a nitride film.

9. The method as claim 1, wherein said dielectric film comprises a first oxide film, a nitride film, and a second oxide film.

10. A method for fabricating a capacitor on a semiconductor device, said method comprising:

forming a first dielectric layer on said semiconductor device, said semiconductor device being on a substrate, said semiconductor having a bit line, said capacitor being located over said bit line;

forming a second dielectric layer on said first dielectric layer, said second dielectric layer is formed of silicon nitride;

etching said first dielectric layer, said second dielectric layer and said semiconductor device to form a hole contacting said substrate;

forming a first conductive layer in said hole and said on said second dielectric layer, wherein said first conductive layer comprises doped poly-silicon;

patterning said first conductive layer to form a bottom electrode of said capacitor;

forming a third dielectric layer on said first conductive layer, a portion of said first conductive layer is not covered by said third dielectric layer;

oxidizing said third dielectric layer and said first conductive layer to form a silicon dioxide layer on said third dielectric layer and said portion of said first conductive layer;

removing said silicon dioxide layer by using HF solution as an etchant, said etchant having the etching selectivity between oxide and poly-silicon about 100 to 1;

etching said third dielectric layer and said portion of said first conductive layer till said third dielectric layer on the top surface of said first conductive layer is removed;

patterning a dielectric film on said first conductive layer and on said third dielectric layer at side wall of said first conductive layer to form the dielectric film of said capacitor; and patterning a second conductive layer on said dielectric film to form a top electric electrode of said capacitor, said first conductive layer, said third dielectric layer at side wall of said first conductive layer, said dielectric film on surface of said first conductive layer and on said third dielectric layer at side wall of said first conductive layer, and said second conductive layer constituting said capacitor.

11. The method as claim 10, wherein said method further comprises removing said second dielectric layer before patterning said second conductive layer.

12. The method as claim 10, wherein said first dielectric layer is a Chemical Vapor Deposition (CVD) silicon dioxide layer.

13. The method as claim 10, wherein said third dielectric layer comprises undoped poly-silicon.

14. The method as claim 10, wherein said silicon dioxide layer is formed by low temperature wet oxidation in oxygen ambient in the oxidation temperature about 700–950° C.

15. The method as claim 10, wherein said dielectric film comprises a first oxide film and a nitride film.

16. The method as claim 10, wherein said dielectric film comprises a first oxide film, a nitride film, and a second oxide film.

* * * * *